(12) United States Patent
Lu et al.

(10) Patent No.: US 11,895,821 B2
(45) Date of Patent: Feb. 6, 2024

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Jingwen Lu, Hefei (CN); Haihan Hung, Hefei (CN); Bingyu Zhu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 388 days.

(21) Appl. No.: 17/467,556

(22) Filed: Sep. 7, 2021

(65) Prior Publication Data

US 2022/0020749 A1 Jan. 20, 2022

Related U.S. Application Data

(63) Continuation of application No. PCT/CN2021/103618, filed on Jun. 30, 2021.

(30) Foreign Application Priority Data

Jul. 16, 2020 (CN) .......................... 202010685792.6

(51) Int. Cl.
    *H01L 27/108* (2006.01)
    *H01L 29/66* (2006.01)
    *H10B 12/00* (2023.01)

(52) U.S. Cl.
    CPC ....... *H10B 12/312* (2023.02); *H01L 29/6656* (2013.01); *H10B 12/482* (2023.02)

(58) Field of Classification Search
    CPC ............. H10B 12/0335; H10B 12/312; H10B 12/482; H10B 12/485; H01L 21/28141;
    (Continued)

(56) References Cited

U.S. PATENT DOCUMENTS 8,507,374 B2   8/2013 Kim
9,293,362 B2   3/2016 Lee et al.
(Continued)

FOREIGN PATENT DOCUMENTS

CN   101207149 A   6/2008
CN   103903994 A   7/2014
(Continued)

OTHER PUBLICATIONS

International Search Report in the international application No. PCT/CN2021/100793, dated Sep. 18, 2021, 2 pgs.
(Continued)

*Primary Examiner* — David C Spalla
(74) *Attorney, Agent, or Firm* — Cooper Legal Group, LLC

(57) ABSTRACT

A semiconductor structure and a manufacturing method thereof are provided. The manufacturing method of the semiconductor structure includes: providing a substrate; forming on an upper surface of the substrate first patterns each including a first main body and a first flank wall covering a sidewall of the first main body; forming a filling layer which covers the first flank wall and fills a gap between adjacent first patterns; and etching a top of each of the first patterns to obtain second main bodies, second flank walls and protrusions located on upper surfaces of the second flank walls, the second flank wall covering a sidewall of the second main body, and a top of the protrusion being at least higher than a top of the second main body.

20 Claims, 12 Drawing Sheets

(58) Field of Classification Search
CPC ............. H01L 29/0653; H01L 29/6653; H01L 29/66553; H01L 29/6656
See application file for complete search history.

(56) References Cited

U.S. PATENT DOCUMENTS

| | | | |
|---|---|---|---|
| 9,431,514 B2 | 8/2016 | Liu et al. | |
| 10,062,714 B2 | 8/2018 | Doris et al. | |
| 10,559,570 B2 | 2/2020 | Nagai | |
| 10,658,489 B2 | 5/2020 | Zheng et al. | |
| 2012/0025296 A1* | 2/2012 | Kim | H10B 12/36 257/E27.084 |
| 2014/0175659 A1 | 6/2014 | Lee et al. | |
| 2016/0172304 A1 | 6/2016 | Lee et al. | |
| 2016/0181395 A1 | 6/2016 | Liu et al. | |
| 2016/0293638 A1 | 10/2016 | Doris et al. | |
| 2018/0261610 A1 | 9/2018 | Zheng et al. | |
| 2019/0221569 A1 | 7/2019 | Nagai | |
| 2019/0355728 A1* | 11/2019 | Kim | H10B 12/315 |
| 2020/0043791 A1* | 2/2020 | Liu | H01L 29/6656 |
| 2020/0152636 A1 | 5/2020 | Nagai | |
| 2020/0152639 A1* | 5/2020 | Ho | H01L 23/5226 |
| 2020/0194439 A1* | 6/2020 | Kim | H01L 29/66553 |
| 2022/0335984 A1* | 10/2022 | Lu | H10B 12/0335 |

FOREIGN PATENT DOCUMENTS

| | | |
|---|---|---|
| CN | 108321090 A | 7/2018 |
| CN | 108574005 A | 9/2018 |
| CN | 109950312 A | 6/2019 |
| CN | 110896032 A | 3/2020 |
| CN | 210272309 U | 4/2020 |
| CN | 111162076 A | 5/2020 |
| KR | 20080088098 A | 10/2008 |

OTHER PUBLICATIONS

International Search Report in the international application No. PCT/CN2021/103618, dated Sep. 29, 2021, 3 pgs.

* cited by examiner

SEMICONDUCTOR STRUCTURE AND MANUFACTURING METHOD THEREOF

CROSS-REFERENCE TO RELATED APPLICATIONS

This is a continuation application of International Patent Application No. PCT/CN2021/103618, filed on Jun. 30, 2021, which claims priority to Chinese Patent Application No. 202010685792.6, filed on Jul. 16, 2020, entitled "Semiconductor Structure and Manufacturing Method Thereof". The disclosures of International Patent Application No. PCT/CN2021/103618 and Chinese Patent Application No. 202010685792.6 are incorporated by reference herein in their entireties.

BACKGROUND

Dynamic Random Access Memory (DRAM) is a kind of semiconductor memory. With the development of semiconductor technology, an integration level is higher and higher, a process of the DRAM is continuously miniaturized, and the sizes of devices in the DRAM, such as the sizes of a Word Line (WL) and a Bit Line (BL), are also miniaturized accordingly.

However, after the bit line is etched, a thin bit line wall is prone to distortion or inclination, so that a sidewall spacer layer deposited on a sidewall of the bit line cannot well wrap the sidewall, and a wire cannot be well filled between a transistor and a capacitor, thereby affecting the performance of the DRAM.

SUMMARY

The present disclosure relates to the technical field of integrated circuits, and in particular relates to a semiconductor structure and a manufacturing method thereof.

According to a first aspect of the disclosure, there is provided a manufacturing method of a semiconductor structure.

The manufacturing method of the semiconductor structure includes the following operations.

A substrate is provided.

First patterns are formed on an upper surface of the substrate. The first patterns each include a first main body and a first flank wall covering a sidewall of the first main body.

A filling layer covering the first flank walls and filling a gap between adjacent first patterns is formed.

A top of each of the first patterns is etched to obtain second main bodies, second flank walls and protrusions located on upper surfaces of the second flank walls. The second flank wall covers a sidewall of the second main body and a top of the protrusion is at least higher than a top of the second main body.

According to a second aspect of the disclosure, there is further provided a semiconductor structure manufactured by the following operations. A substrate is provided. First patterns are formed on an upper surface of the substrate. The first patterns each include a first main body and a first flank wall covering a sidewall of the first main body. A filling layer covering the first flank walls and filling a gap between adjacent first patterns is formed. A top of each of the first patterns is etched to obtain second main bodies, second flank walls and protrusions located on upper surfaces of the second flank walls. The second flank wall covers a sidewall of the second main body and a top of the protrusion is at least higher than a top of the second main body.

BRIEF DESCRIPTION OF THE DRAWINGS

In order to more clearly illustrate the technical solutions of the embodiments of the present disclosure or the conventional technology, the following will briefly introduce the accompanying drawings required for describing the embodiments or the conventional technology. Apparently, the accompanying drawings in the following description show only some embodiments of the present disclosure, and a person of ordinary skill in the art may still derive other drawings from these accompanying drawings without creative efforts.

DETAILED DESCRIPTION

Figure 1:
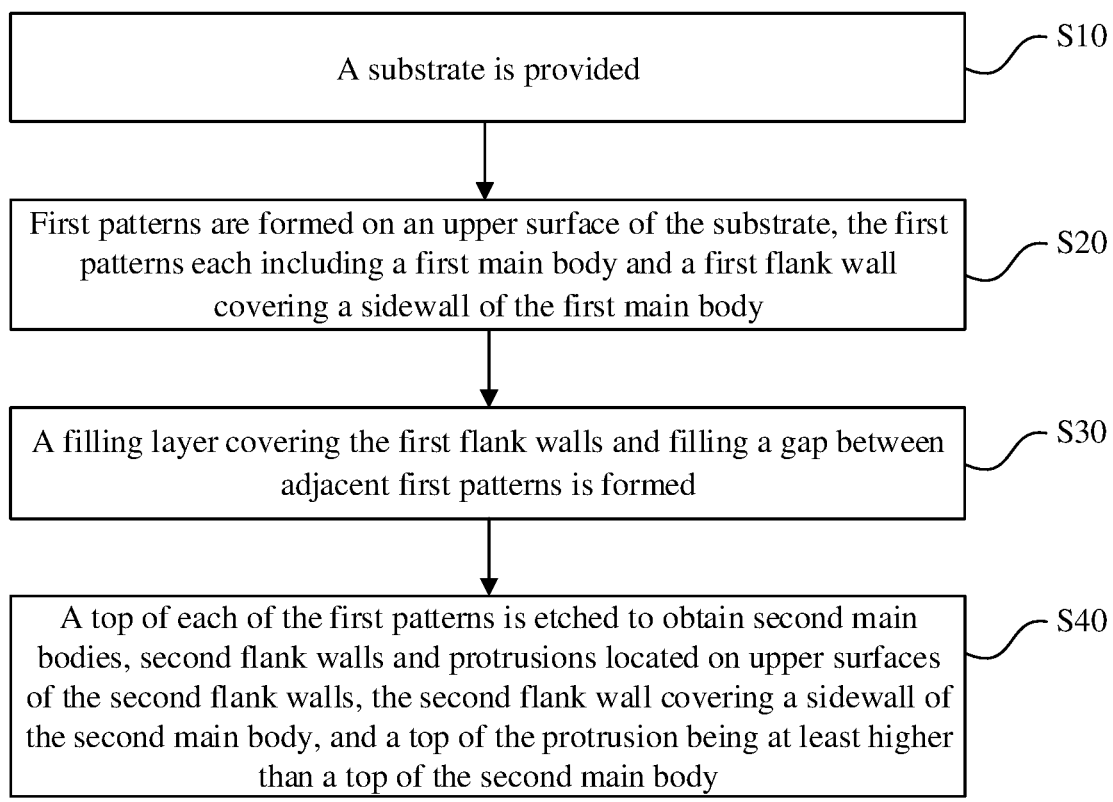
FIG. 1 is a flow chart of a manufacturing method of a semiconductor structure provided in an embodiment.

For convenience of an understanding of the present disclosure, the present disclosure will now be described more fully hereinafter with reference to the related drawings. Preferred embodiments of the present disclosure are given in the related drawings. The present disclosure may, however, be embodied in many different forms which are not limited to the embodiments described herein. Rather, these embodiments are provided for the purpose of making the contents in this disclosure more thorough and comprehensive.

Unless defined otherwise, all technical and scientific terms used herein have the same meaning as commonly understood by those skilled in the art to which the present disclosure belongs. The terms used herein in the specification of the present disclosure is for the purpose of describing specific embodiments only and is not intended to limit the present disclosure.

It is to be understood that when an element or layer is referred to as being "on", "adjacent to", "connected to" or "coupled to" other elements or layers, it may be directly on, adjacent to, connected or coupled to the other elements or layers, or an intervening element or layer may exist. Rather, when an element is referred to as being "directly on", "directly adjacent to", "directly connected to" or "directly coupled to" other elements or layers, no intervening elements or layers exist. It is to be understood that although the terms "first", "second", "third", etc. may be used to describe various elements, components, regions, layers, doping types and/or portions, these elements, components, regions, layers, doping types and/or portions should not be limited by these terms. These terms are only used to distinguish one element, component, region, layer, doping type or portion from another element, component, region, layer, doping type or portion. Therefore, a first element, component, region, layer, doping type or portion discussed below may be represented as a second element, component, region, layer or portion without departing from the teachings of the present disclosure. For example, a first doping type may be referred to as a second doping type, and similarly the second doping type may be referred to as the first doping type. The first doping type and the second doping type are different doping types. For example, the first doping type may be P-type and the second doping type may be N-type, or the first doping type may be N-type and the second doping type may be P-type.

Spatial relationship terms such as "beneath", "below", "lower", "under", "above", or "upper" may be used herein to describe a relationship between one element or feature and another element or feature shown in the figures. It should be understood that in addition to the orientations shown in the figures, the spatial relationship terms further include different orientations of devices in use and operation. For example, if the devices in the figures are turned over, an element or feature described as being "below" or "under" or "beneath" another element will be oriented as being "on/above" the other element or feature. Therefore, the exemplary terms "below" and "under" may include up and down orientations. In addition, the device may also include additional orientations (e.g., rotation for 90 degrees or other orientations), and the spatial descriptors used herein are interpreted accordingly.

As used herein, the singular forms "a", "an", and "said/the" may include the plural forms as well, unless the context clearly dictates another forms otherwise. It is to be further understood that when the terms "is composed of" and/or "includes" are used in this specification, it can be determined that the stated features, integers, steps, operations, elements, and/or components are presented, but the presence or addition of one or more other features, integers, steps, operations, elements, components, and/or groups are not excluded. Also, as used herein, the term "and/or" includes any and all combinations of associated listed items.

Embodiments of the present disclosure are described herein with reference to cross-sectional views that are schematic diagrams of ideal embodiments (and intermediate structures) of the present disclosure, such that variations from the illustrated shapes due to, for example, manufacturing techniques and/or tolerances may be expected. Therefore, embodiments of the present disclosure should not be limited to particular shapes of regions illustrated herein, but include deviations in shapes due to, for example, manufacturing techniques. For example, injection regions shown as rectangles typically have rounded or curved features and/or injection concentration gradients at their edges rather than binary changes from injection regions to non-injection regions. Also, a buried region formed by injection may result in some injections in a region between the buried region and the surface through which the injection is performed. Therefore, the regions shown in the figures are schematic in essence and their shapes do not represent actual shapes of the regions of the devices and does not limit the scope of the disclosure.

Referring to FIG. 1, according to an embodiment, there is provided a manufacturing method of a semiconductor structure, including the following steps.

At step S10, a substrate 10 is provided.

At step S20, first patterns 20 are formed on an upper surface of the substrate 10. The first patterns 20 each include a first main body 210 and a first flank wall 220, and the first flank wall 220 covers a sidewall of the first main body 210.

At step S30, a filling layer 30 is formed. The filling layer 30 covers sidewalls of the first flank walls 220 and fills a gap between adjacent first patterns 20.

At step S40, a top of each of the first patterns 20 is etched to obtain second main bodies 230, second flank walls 240 and protrusions 241 located on upper surfaces of the second flank walls 240. The second flank wall 240 covers a sidewall of the second main body 230. A top of the protrusion 241 is at least higher than a top of the second main body 230.

In the above manufacturing method of the semiconductor structure, the first patterns 20 are formed on the upper surface of the substrate 10. The first patterns 20 each include the first main body 210 and the first flank wall 220, and the first flank wall 220 covers the side wall of the first main body 210. The second main bodies 230, the second flank walls 240 and the protrusions 241 located on upper surfaces of the second flank walls 240 can be obtained by etching the top of each of the first patterns 20. Since the formed filling layer 30 covers the first flank walls 220 and fills the gap between the adjacent first patterns 20, the filling layer 30 can provide support for the second main body 230 in the process of forming the semiconductor structure, which guarantees that a structure reserved after the second main body 230 is etched is not distorted or inclined. Since the top of the protrusion 241 is at least higher than the top of the second main body 230, a mask layer can be formed along a horizontal direction by taking the protrusion 241 on the upper surface of the second flank wall 240 as center in a subsequent process, to realize self-alignment during an etching process of the second main body, and improve the manufacturing precision of the semiconductor structure.

It is to be understood that although the steps of the flowcharts in FIG. 1 are shown sequentially as indicated by the arrows, the steps are not necessarily performed sequentially as indicated by the arrows. Unless specifically stated otherwise herein, the steps are not performed in a strict order of limitation, and the steps may be performed in other orders. Moreover, at least part of the steps in the flowchart of FIG. 1 may include multiple steps or stages that are not necessarily performed at the same time, but may be performed at different times, and the steps or stages are not necessarily performed in sequence, but rather may be performed in turns or alternation with other steps or at least part of the steps or stages in the other steps.

In one of embodiments, the substrate 10 provided at step S10 may include any existing semiconductor substrate 10. In the embodiment, the substrate 10 may include, but is not limited to, a silicon substrate. A shallow trench isolation structure can be formed in the substrate 10, and the shallow trench isolation structure isolates a plurality of active regions arranged at intervals from each other in the substrate 10.

In one of embodiments, at step S20, forming the first patterns 20 on the upper surface of the substrate 10 includes the following steps.

At step S210, a bit line material stack 214 including a bit line barrier layer 211, a bit line conductive layer 212 and a bit line insulating layer 213 is formed on the upper surface of the substrate 10.

At step S220, the bit line material stack 214 is etched to obtain a plurality of first main bodies 210. A gap is formed between adjacent first main bodies 210 to expose the substrate 10.

At step S230, the first flank wall 220 is formed on the sidewall of the first main body 210.

Figure 2:
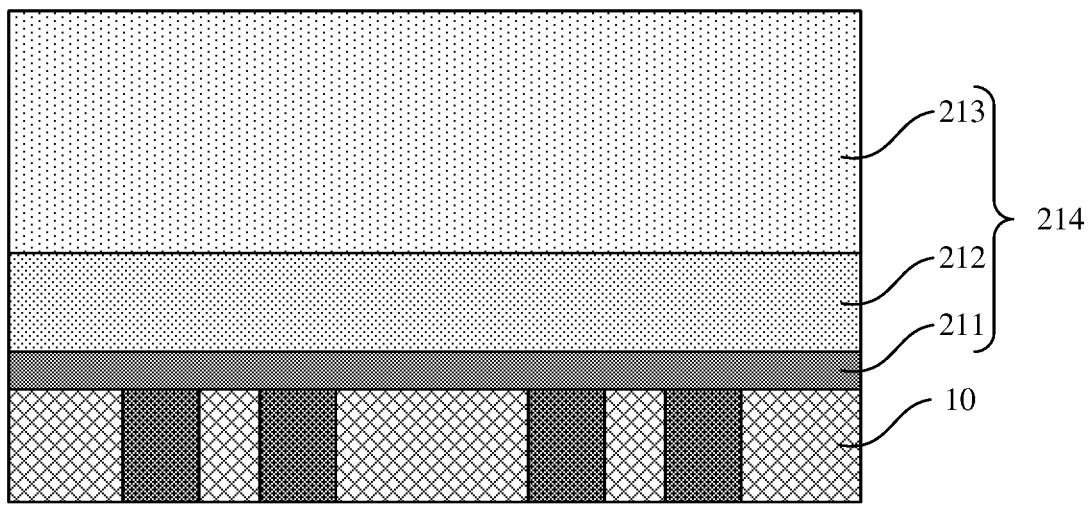
FIG. 2 is a schematic structural diagram of a cross section of a structure obtained after a bit line material stack including a bit line barrier layer, a bit line conductive layer and a bit line insulating layer is formed on an upper surface of a substrate, in a manufacturing method of a semiconductor structure provided in an embodiment.

Please refer to FIG. 2, in one of embodiments, at step S210, the bit line barrier layer 211, the bit line conductive layer 212 and the bit line insulating layer 213 may be formed in this order on the upper surface of the substrate 10 by adopting a deposition process, to form the bit line material stack 214. That is, the bit line barrier layer 211, the bit line conductive layer 212 and the bit line insulating layer 213 together constitute the bit line material stack 214. The materials and thicknesses of the bit line barrier layer 211, the bit line conductive layer 212 and the bit line insulating layer 213 can be set according to actual needs. In the embodiment, the bit line barrier layer 211 may include, but is not limited to, a titanium nitride (TiN) layer. The bit line conductive layer 212 may include, but is not limited to, a tungsten layer. The bit line insulating layer 213 may include, but is not limited to, a silicon nitride layer.

Figure 3:
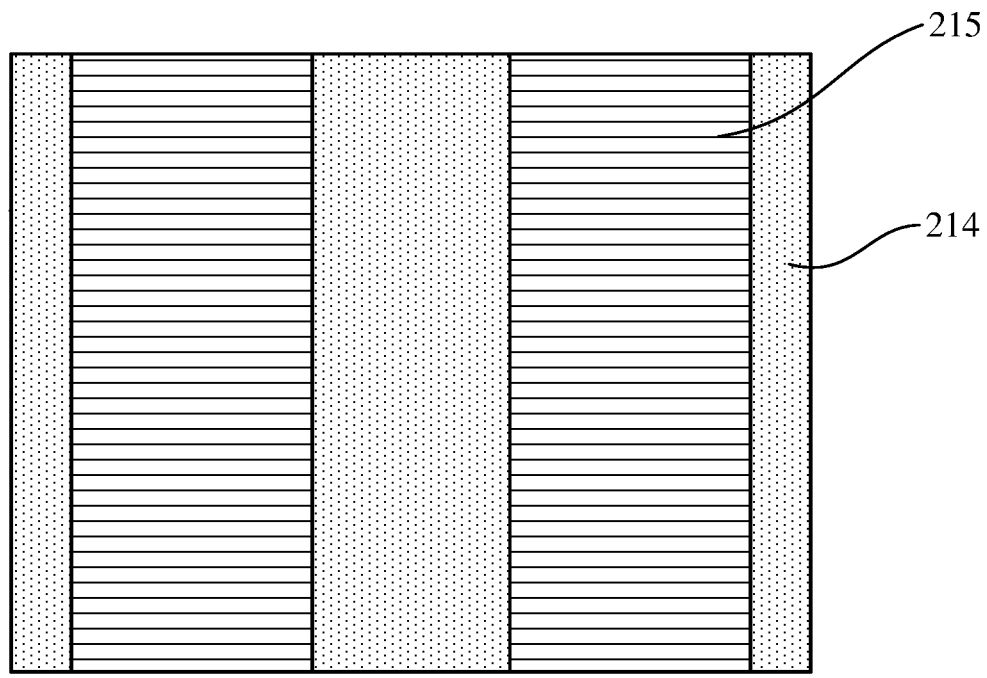
FIG. 3 is a schematic structural diagram of a cross section of a structure obtained after a sacrificial layer is formed on an upper surface of the bit line material stack and the sacrificial layer is patterned to form a photolithographic mask layer, in a manufacturing method of a semiconductor structure provided in an embodiment.
Figure 4:
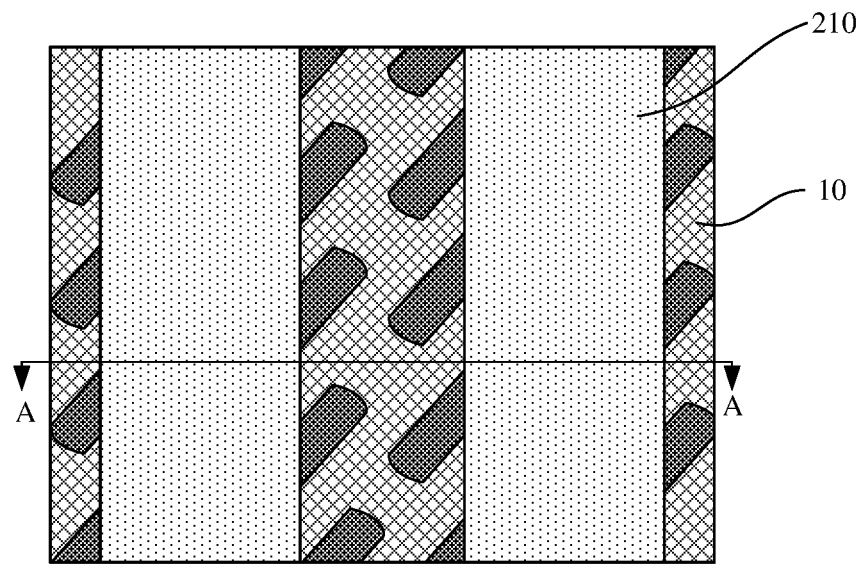
FIG. 4 is a top schematic structural diagram of first main bodies obtained after the bit line material stack is etched and the sacrificial layer is removed, in a manufacturing method of a semiconductor structure provided in an embodiment.
Figure 5:
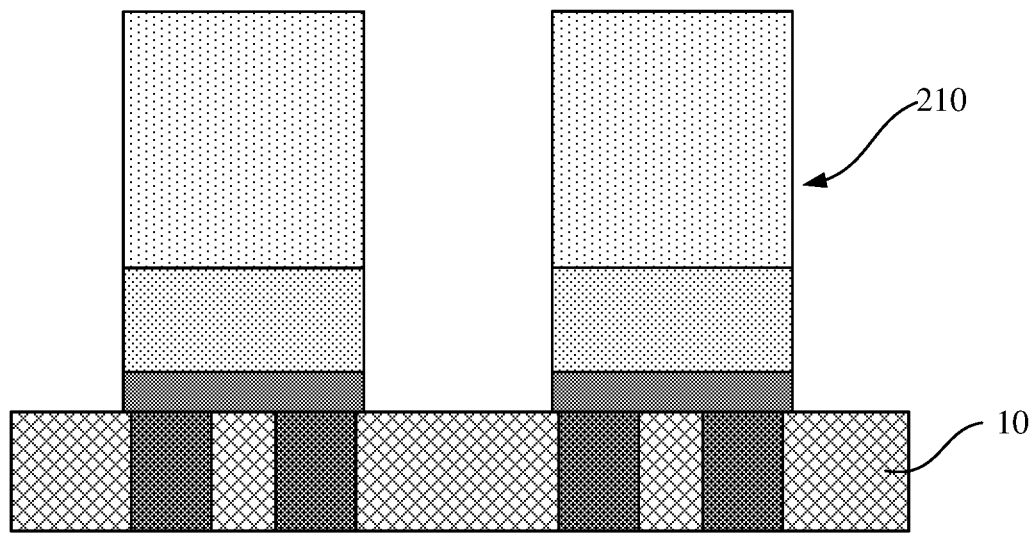
FIG. 5 is a schematic structural diagram of a cross section, taken along an A-A direction in FIG. 4, of first main bodies obtained after the bit line material stack is etched and the sacrificial layer is removed, in a manufacturing method of a semiconductor structure provided in an embodiment.

Please refer to FIG. 3 to FIG. 5, in one of embodiments, at step S220, a sacrificial layer can be formed on an upper surface of the bit line material stack 214 by adopting, but not limited to, a spin coating process, and the sacrificial layer is patterned to form a photolithographic mask layer 215. The sacrificial layer may be a photoresist layer. The bit line material stack 214 is etched on the basis of the photolithographic mask layer 215 and is etched to the upper surface of the substrate 10. After the photolithographic mask layer 215 is removed, the plurality of first main bodies 210 may be formed. In one of embodiments, a width of first main body 210 is the sum of a width between two adjacent third main bodies 40 and widths of the two third main bodies 40, thereby ensuring that the two adjacent third main bodies 40 can be formed on the upper surface of the substrate 10 after the first main body 210 is etched. In one of embodiments, the third main body 40 may be a bit line.

In one of embodiments, at step S230, forming the first flank wall 220 on the sidewall of the first main body 210 includes the following steps.

At step S231, a first sidewall spacer layer 221 is formed on a sidewall of the first main body 210.

At step S232, a second sidewall spacer layer 222 is formed on a sidewall of the first sidewall spacer layer 221.

At step S233, a third sidewall spacer layer 223 is formed on a sidewall of the second sidewall spacer layer 222.

The first sidewall spacer layer 221, the second sidewall spacer layer 222 and the third sidewall spacer layer 223 together constitute the first flank wall 220.

Figure 6:
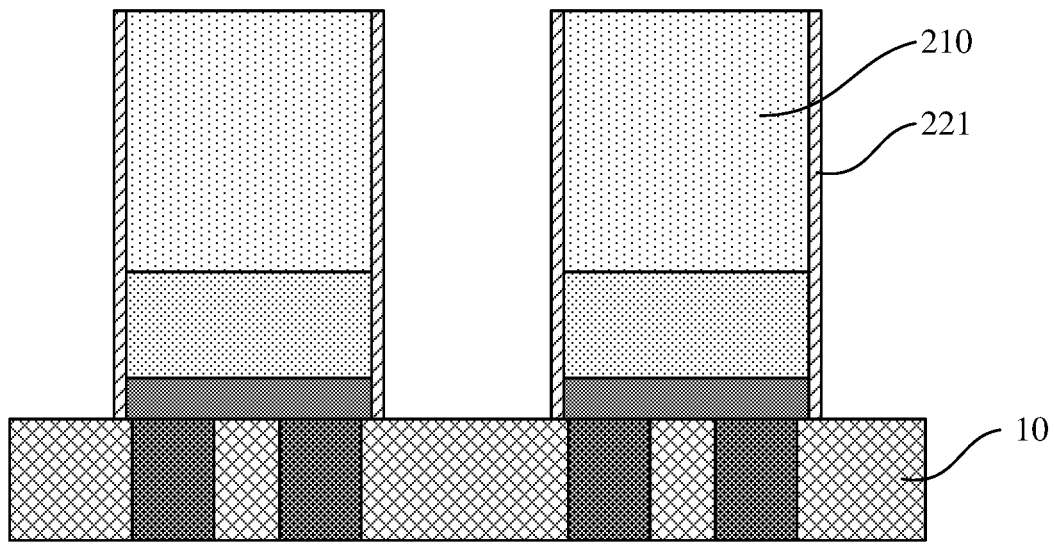
FIG. 6 is a schematic structural diagram of a cross section of a structure obtained after a first sidewall spacer layer is formed on a sidewall of the first main body, in a manufacturing method of a semiconductor structure provided in an embodiment.

Please refer to FIG. 6, in one of embodiments, at step S231, a first sidewall spacer material layer may be formed by using, but not limited to, a deposition process. In the embodiment, a single Atomic Layer Deposition (ALD) process may be adopted to form the first sidewall spacer material layer on the upper surface and the sidewall of the first main body 210 and on the upper surface of the substrate 10. Then, the first sidewall spacer material layer may be etched by using, but not limited to, a dry etching process to remove first sidewall spacer material on the upper surface of the first main body 210 and on the upper surface of the substrate 10, to form the first sidewall spacer layer 221. $SF_6$, $CF_4$, $O_2$, Ar or a mixed gas of the above gases can be adopted in the dry etching process, and specific gas selection can be set according to actual needs. In addition, the material and thickness of the first sidewall spacer layer 221 can be set according to actual needs. In the embodiment, the first sidewall spacer layer 221 may include, but is not limited to, a silicon nitride layer.

Figure 7:
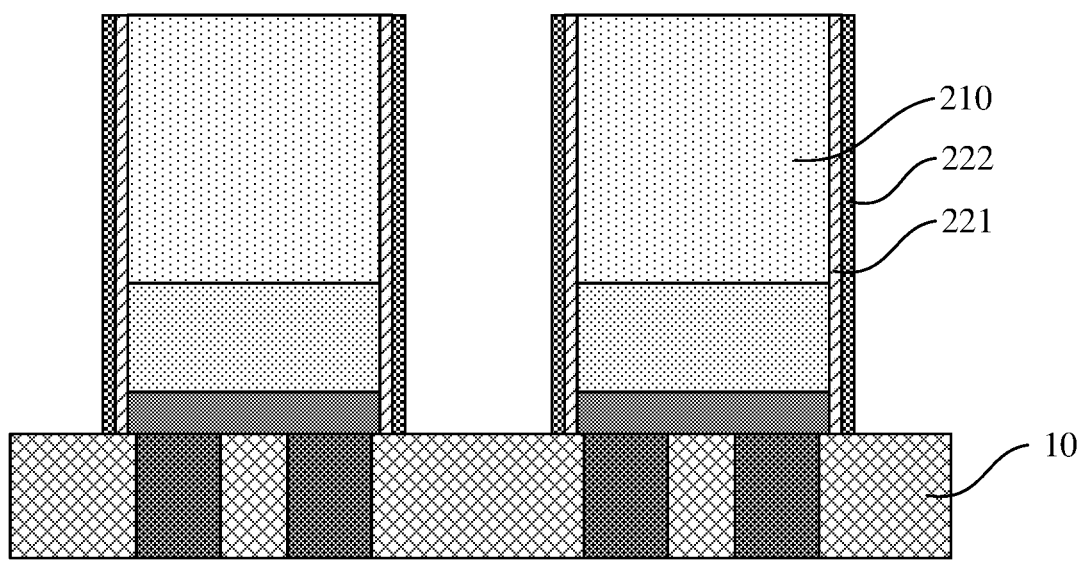
FIG. 7 is a schematic structural diagram of a cross section of a structure after a second sidewall spacer layer is formed on a surface of the first sidewall spacer layer, in a manufacturing method of a semiconductor structure provided in an embodiment.

Please refer to FIG. 7, in one of embodiments, at step S232, a second sidewall spacer material layer may be formed by using, but not limited to, a deposition process. In the embodiment, an ALD process may be adopted to form the second sidewall spacer material layer on the upper surface of the first main body 210, the sidewall of the first sidewall spacer layer 221 and the upper surface of the substrate 10. Then, the second sidewall spacer material layer may be etched by using, but not limited to, a dry etching process to remove second sidewall spacer material on the upper surface of the first main body 210 and on the upper surface of the substrate 10, to form the second sidewall spacer layer 222. $SF_6$, $CF_4$, $O_2$, Ar or a mixed gas of the above gases can be adopted in the dry etching process, and specific gas selection can be set according to actual needs. In addition, the material and thickness of the second sidewall spacer layer 222 can be set according to actual needs. In the embodiment, the second sidewall spacer layer 222 may include, but is not limited to, a silicon nitride layer.

Figure 8:
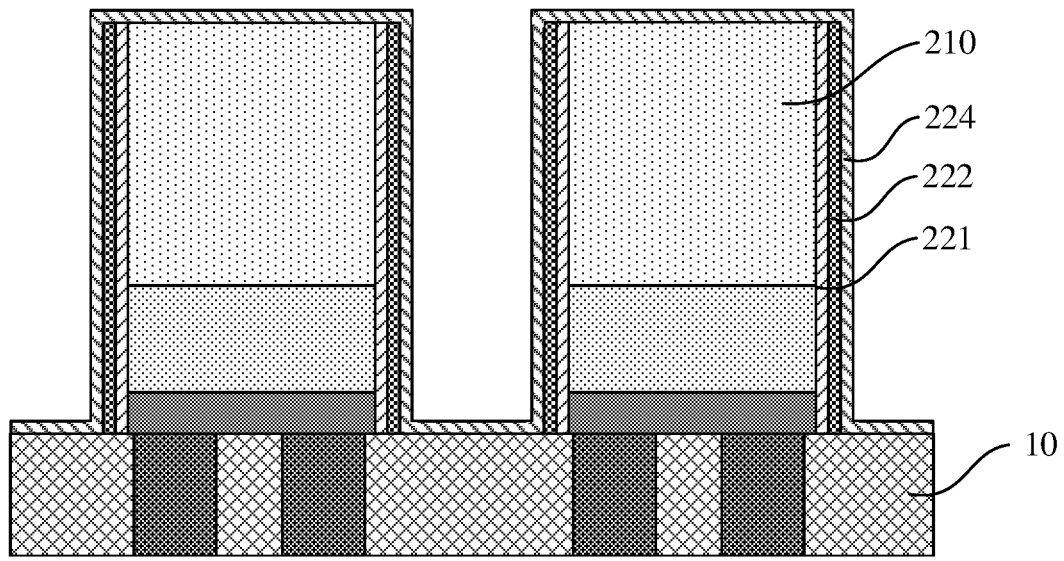
FIG. 8 is a schematic structural diagram of a cross section of a structure obtained after a third sidewall spacer material layer is formed on an upper surface of the first main body, a surface of the second sidewall spacer layer, and an upper surface of the substrate, in a manufacturing method of a semiconductor structure provided in an embodiment.
Figure 9:
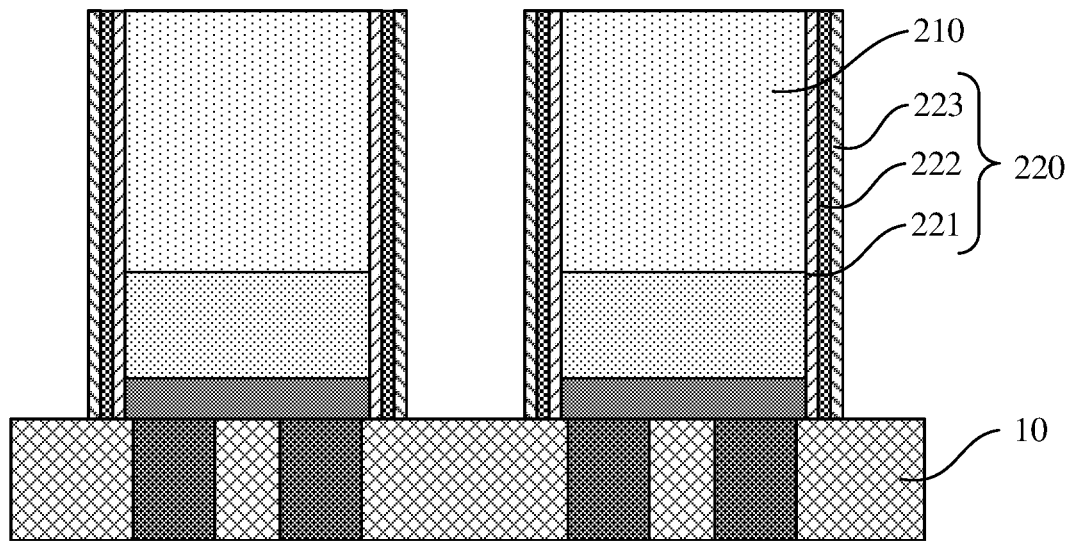
FIG. 9 is a schematic structural diagram of a cross section of a structure obtained after the upper surface of the first main body and the upper surface of the substrate are removed to form the third sidewall spacer layer, in a manufacturing method of a semiconductor structure provided in an embodiment.

Please refer to FIG. 8 to FIG. 9, in one of embodiments, at step S233, a third sidewall spacer material layer 224 may be formed by using, but not limited to, a deposition process. In the embodiment, an ALD process may be adopted to form the third sidewall spacer material layer 224 on the upper surface of the first main body 210, the sidewall of the second sidewall spacer layer 222 and the upper surface of the substrate 10 due to good step coverage of the ALD process. The material and thickness of the third sidewall spacer material layer 224 can be set according to actual needs. Then, the third sidewall spacer material layer may be etched by using, but not limited to, a dry etching process to remove third sidewall spacer material on the upper surface of the first main body 210 and on the upper surface of the substrate 10 to form the third sidewall spacer layer 223. $SF_6$, $CF_4$, $O_2$, Ar or a mixed gas of the above gases can be adopted in the dry etching process, and specific gas selection can be set according to actual needs. In addition, the material and thickness of the third sidewall spacer layer 223 can be set according to actual needs. In the embodiment, the third sidewall spacer layer 223 may include, but is not limited to, a silicon nitride layer. In one embodiment, the first flank wall 220 includes a first silicon nitride layer, a silicon oxide layer and a second silicon nitride layer stacked in sequence from the sidewall of the first main body 210 to the outside.

In one of embodiments, at step S30, forming the filling layer 30 includes the following steps.

At step S310, a filling material layer 310 is formed on surfaces of the first patterns 20 and fills a gap between the adjacent first patterns 20.

At step S320, the filling material layer 310 is etched to expose the tops of the first patterns 20.

Figure 10:
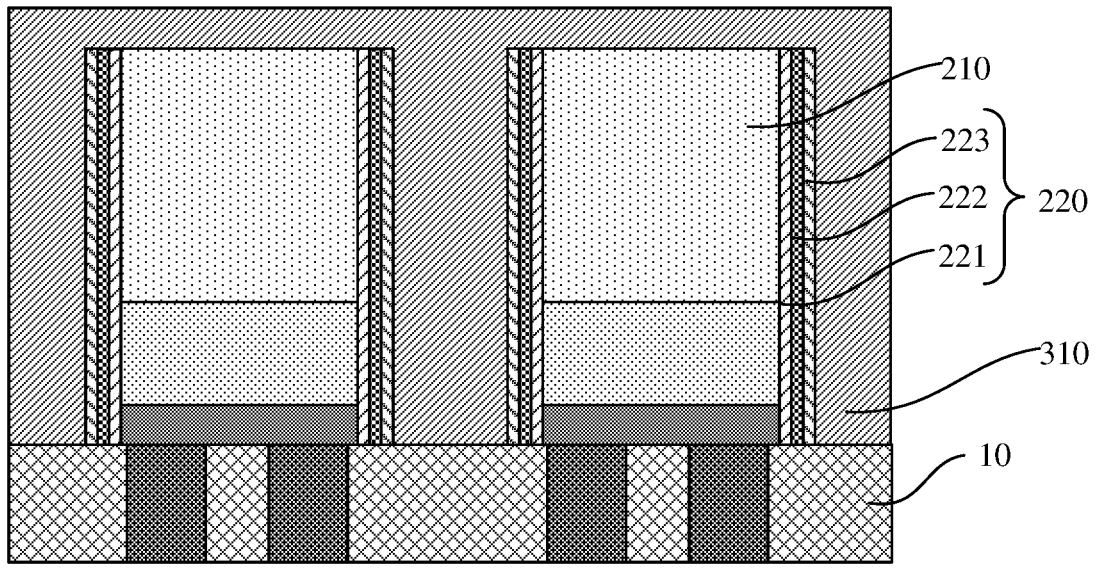
FIG. 10 is a schematic structural diagram of a cross section of a structure obtained after a filling material layer is formed on the upper surface of the first main body and a surface of the first flank wall, in a manufacturing method of a semiconductor structure provided in an embodiment.

Please refer to FIG. 10, in one of embodiments, at step S310, a filling material layer 310 may be formed on the upper surfaces of the first main bodies 210 and in the gap between the adjacent first patterns 20 by using, but not limited to, a Spin-on Dielectrics (SOD) process, and then is annealed to solidify the filling material layer 310. The annealed and solidified filling material layer 310 can fill the gap between the adjacent first patterns 20, so it can provide support for the third main body 40 in a direction perpendicular to a sidewall of the third main body 40 in the process of manufacturing the third main body 40, which can avoid distortion or inclination of the third main body 40 in the manufacturing process, and can ensure that the second flank wall 240 and a subsequent third flank wall 250 can well wrap the sidewall of the third main body 40, thus a wire can be well filled between a subsequent transistor and a capacitor, and the performance of a Dynamic Random Access Memory (DRAM) is guaranteed. In one of embodiments, the material of the filling material layer 310 can all be the same as that of the second sidewall spacer layer 222. In the embodiment, each of the filling material layer 310 and the second sidewall spacer layer 222 may include, but is not limited to, a silicon nitride layer.

Figure 11:
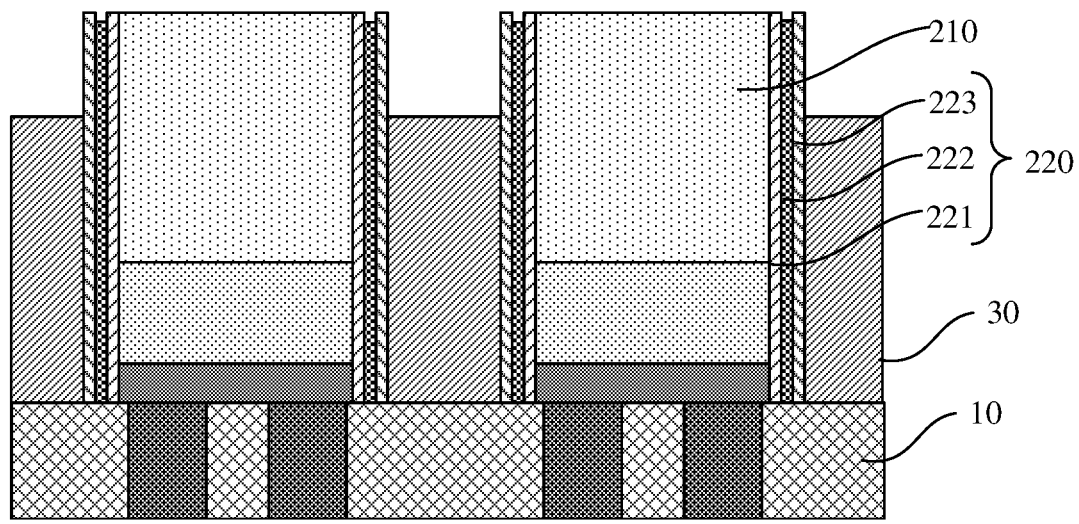
FIG. 11 is a schematic structural diagram of a cross section of a structure obtained after the filling material layer is etched to expose the upper surface of the first main body and a part of first flank wall, in a manufacturing method of a semiconductor structure provided in an embodiment.

Please refer to FIG. 11, in one of embodiments, at step S320, the filling material layer 310 can be etched by using, but not limited to, an etching process to expose the tops of the first patterns 20. The exposed top of the first pattern 20 may be the top of the first flank wall 220 and a side surface of the third sidewall spacer layer 223.

In one of embodiments, after the filling material layer 310 is etched, the top of the filling layer 30 may be lower than the top of the first pattern 20, that is, the top of the filling layer 30 is lower than the top of the first main body 210. The height of the top of the filling layer 30, which is lower than the top of the first pattern 20, can be set according to actual conditions. In one of embodiments, the height of the filling layer 30 is greater than or equal to two thirds of the height of the first pattern 20 to ensure good support of the filling layer 30 to the third main body 40.

In one of embodiments, at step S40, etching the top of each of the first patterns 20 includes the following steps.

At step S410, the first sidewall spacer layer 221, the third sidewall spacer layer 223 and the first main body 210 are etched to expose part of the second sidewall spacer layer 222 to serve as a protrusion 241.

Figure 12:
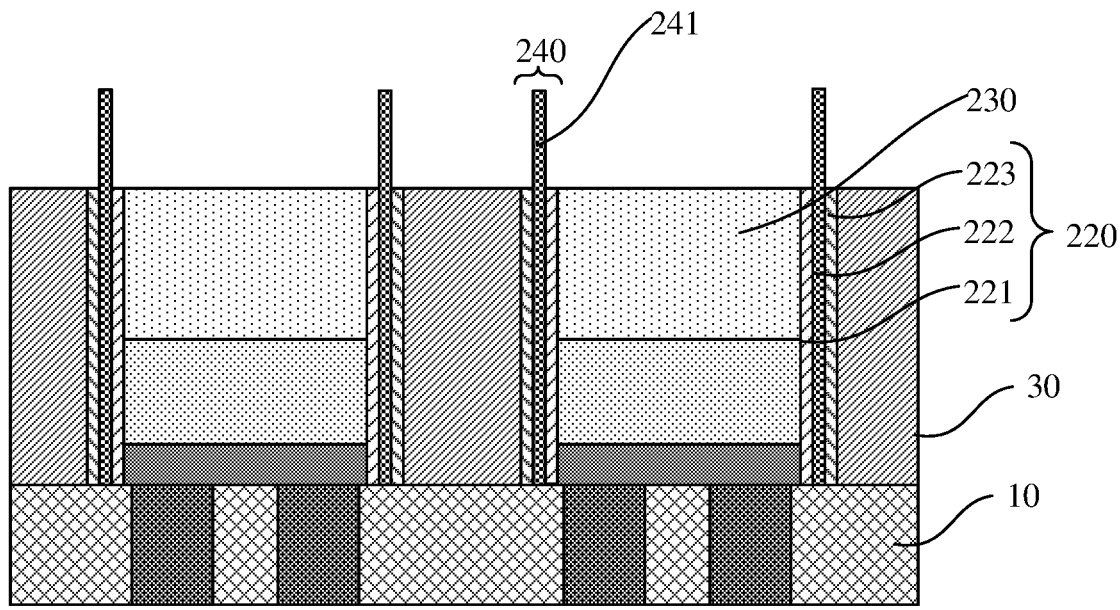
FIG. 12 is a schematic structural diagram of a cross section of a structure obtained after the first sidewall spacer layer, the third sidewall spacer layer and the first main body are etched to expose part of the second sidewall spacer layer, in a manufacturing method of a semiconductor structure provided in an embodiment.

Please refer to FIG. 12, in one of embodiments, at step S410, the first sidewall spacer layer 221, the third sidewall spacer layer 223 and the first main body 210 may be etched by using, but not limited to, an etching process to expose part of the second sidewall spacer layer 222, and the exposed second sidewall spacer layer 222 may serve as protrusion 241 to form the second flank wall 240 with the protrusion 241. The height of the protrusion 241 can be set according to actual needs. In one of embodiments, the bottom of the protrusion 241 is flush with the top of the filling layer 30.

In one of embodiments, S40, after etching the top of each of the first patterns 20, further includes the following steps.

At step S50, a bit line mask layer 50 is formed on a side surface of the protrusion 241.

At step S60, by taking the bit line mask layer 50 and the protrusion 241 as a mask, each second main body 230 is etched to obtain two corresponding adjacent third main bodies 40, and to simultaneously obtain a gap between the two corresponding adjacent third main bodies 40, so as to expose part of the substrate 10.

At step S70, the bit line mask layer 50 and the protrusion 241 are removed to expose upper surfaces of the third main bodies 40.

At step S80, a third flank wall 250 is formed on each of opposite sidewalls between two corresponding adjacent third main bodies 40.

At step S90, the filling layer 30 is removed to expose the second flank wall 240.

In one of embodiments, at step S50, forming the bit line mask layer 50 on the side surface of the protrusion 241 includes the following steps.

At step S510, a bit line mask material layer 510 is formed on an upper surface of the filling layer 30, the surface of the protrusion 241 and the upper surface of the second main body 230 by adopting an atomic layer deposition process.

At step S520, the bit line mask material layer 510 is etched, to reserve only a part of the bit line mask material layer 510 located on the side surface of the protrusion 241, to serve as the bit line mask layer 50.

Figure 13:
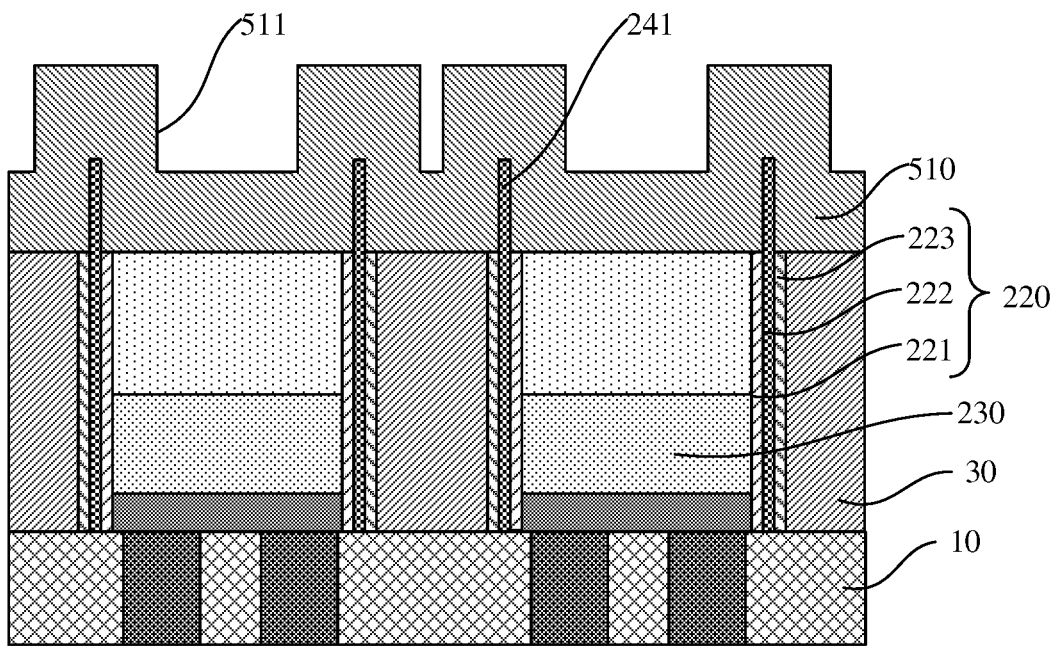
FIG. 13 is a schematic structural diagram of a cross section of a structure obtained after a bit line mask material layer is formed on an upper surface of a filling layer, a surface of a protrusion, and an upper surface of a second main body, in a manufacturing method of a semiconductor structure provided in an embodiment.

Please refer to FIG. 13, in one of embodiments, at step S510, the material and thickness of the bit line mask material layer 510 can be set according to actual needs. In one of embodiments, the material of the bit line mask material layer 510 may be the same as the material of the filling layer 30. In the embodiment, each of the filling layer 30 and the bit line mask material layer 510 can include a silicon oxide layer. When the silicon oxide layer is deposited on each of the upper surface of the filling layer 30, the surface of the protrusion 241 and the upper surface of the second main body 230 through an ALD process, the formed silicon oxide layer has the same thickness in upper, lower, left and right directions. With the increase of the thickness of the silicon oxide layer, a size of an opening 511 in the bit line mask material layer 510 gradually decreases, namely, a step with a height difference is formed. Therefore, when the ALD process is adopted to deposit the silicon oxide layer, the protrusion 241 can be used as the starting point for depositing the silicon oxide layer, so that the opening 511 in the deposited bit line mask material layer 510 is continuously reduced and can be symmetrical about the center of the protrusion 241 to complete self-alignment during an etching process of the third main body 40. In the embodiment, the size of the opening 511 of the bit line mask material layer 510 can be controlled through a deposition rate or a deposition thickness of the ALD process, so that the sizes (widths) of the finally formed third main bodies 40 can be controlled, which simplifies manufacturing process of the third main bodies 40, and improves the manufacturing precision of the third main bodies 40.

Figure 14:
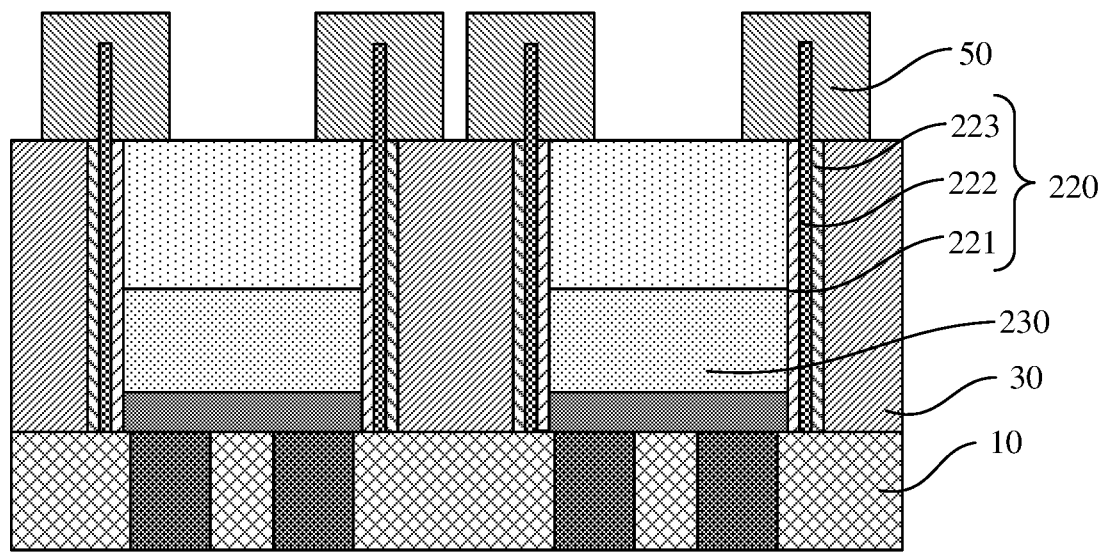
FIG. 14 is a schematic structural diagram of a cross section of a structure obtained after a bit line mask layer is obtained by etching the bit line mask material layer based on a step of the bit line mask material layer, in a manufacturing method of a semiconductor structure provided in an embodiment.

Please refer to FIG. 14, in one of embodiments, at step S520, the bit line mask material layer 510 may be etched based on the step of the bit line mask material layer 510 by using, but not limited to, an etching process, to expose the upper surface of the second main body 230 and to reserve a part of the bit line mask material layer on the side surface of the protrusion 241 to serve as the bit line mask layer 50.

Figure 15:
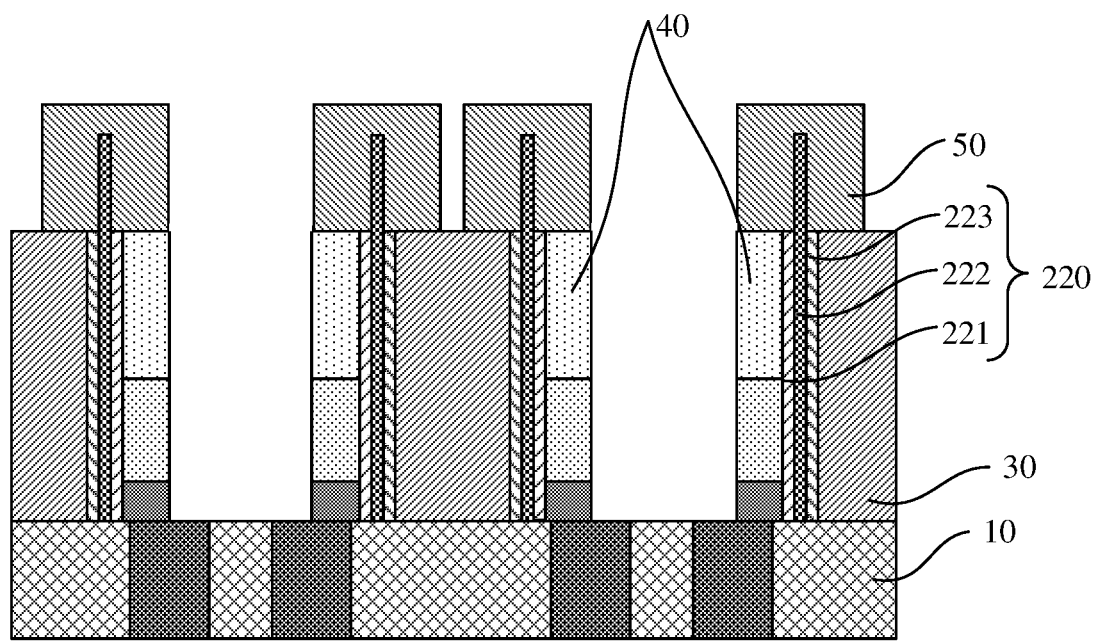
FIG. 15 is a schematic structural diagram of a cross section of a structure obtained after two adjacent third main bodies are obtained by etching the second main body based on the bit line mask layer, in a manufacturing method of a semiconductor structure provided in an embodiment.

Please refer to FIG. 15, in one of embodiments, at step S60, by taking the bit line mask layer 50 and the protrusion 241 as a mask, each second main body 230 may be etched by using, but not limited to, an etching process to expose a part of the substrate 10, so that the two corresponding adjacent third main bodies 40 are obtained. In one of embodiments, the third main body 40 may be a bit line.

In one of embodiments, at step S70, removing the bit line mask layer 50 and the protrusion 241 to expose the upper surfaces of the third main bodies 40 includes the following steps.

At step S710, a sacrificial layer 60 is formed in the gap between two corresponding adjacent third main bodies 40. A height of the sacrificial layer 60 is not larger than a height of the third main body 40 and not lower than a height of the bit line conductive layer 212 portion in the third main body 40.

At step S720, the bit line mask layer 50 and the protrusion 241 are etched to expose the upper surfaces of the third main bodies 40.

Figure 16:
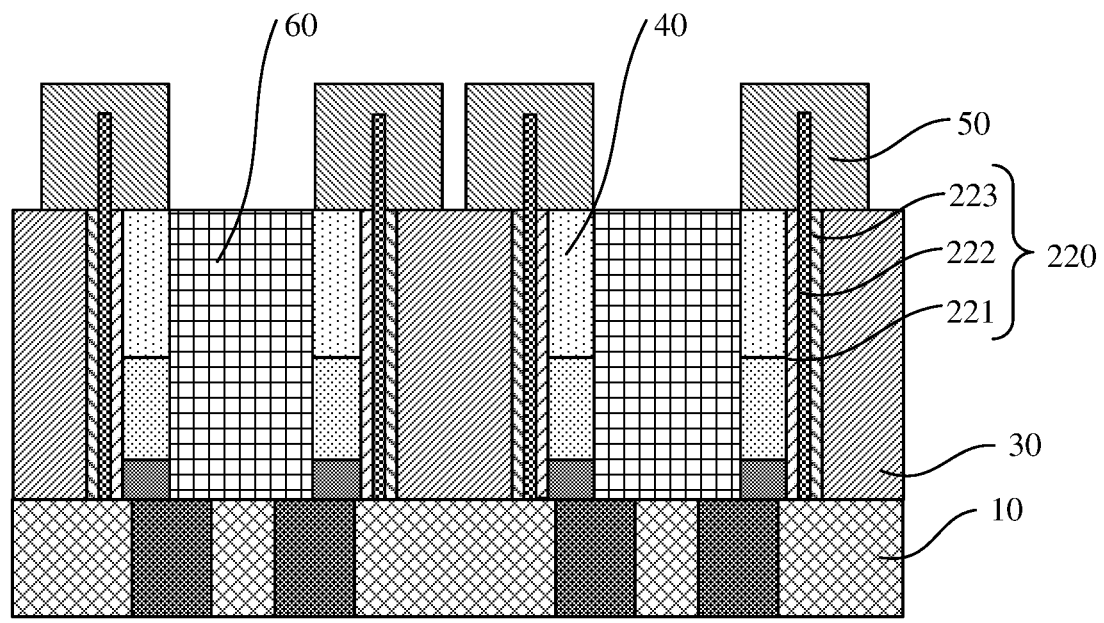
FIG. 16 is a schematic structural diagram of a cross section of a structure obtained after a sacrificial layer is formed in a gap between two adjacent third main bodies, in a manufacturing method of a semiconductor structure provided in an embodiment.

Please refer to FIG. 16, in one of embodiments, at step S710, the sacrificial layer 60 can be formed within the gap between two corresponding adjacent third main bodies 40 by using, but not limited to, a spin coating process. The height of the sacrificial layer 60 is not larger than the height of the third main body 40 and not lower than the height of the bit line conductive layer 212 portion in the third main body 40 to achieve protection on the sidewall of the third main body 40. In one of embodiments, the sacrificial layer 60 may be a photoresist layer.

Figure 17:
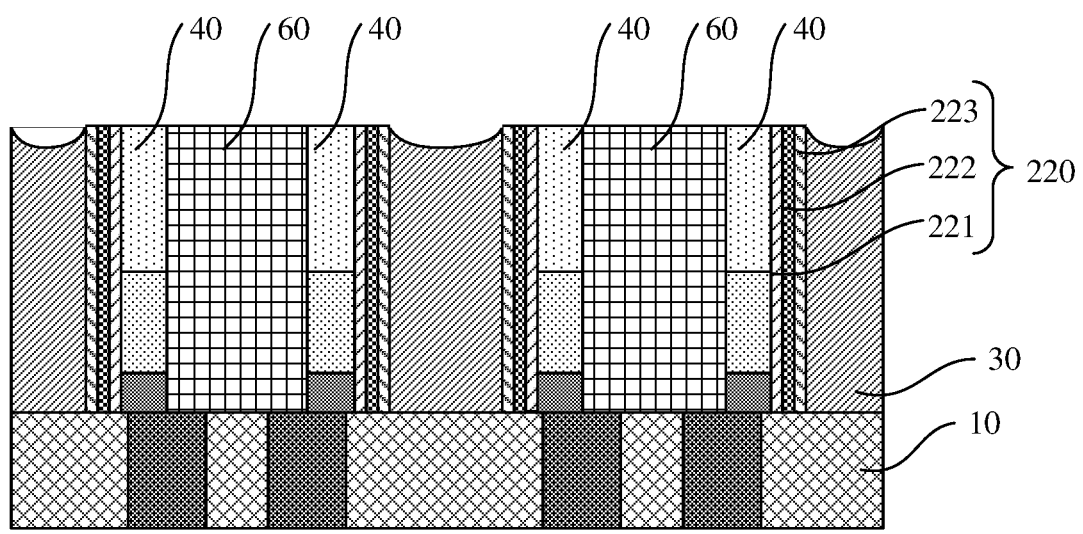
FIG. 17 is a schematic structural diagram of a cross section of a structure obtained after the bit line mask layer and the protrusion are etched to expose upper surfaces of the third main bodies, in a manufacturing method of a semiconductor structure provided in an embodiment.
Figure 18:
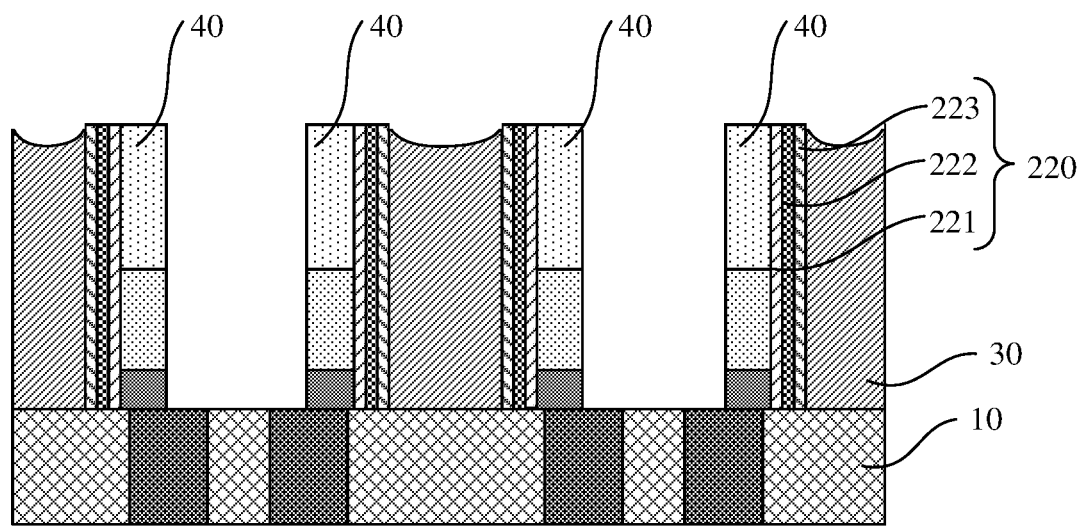
FIG. 18 is a schematic structural diagram of a cross section of a structure obtained after the sacrificial layer is removed, in a manufacturing method of a semiconductor structure provided in an embodiment.

Please refer to FIG. 17 and FIG. 18, in one of embodiments, at step S720, the bit line mask layer 50 and the protrusion 241 may be etched by using, but not limited to, an etching process to remove the bit line mask layer 50 and the protrusion 241 at the tops of the third main bodies 40, namely, to expose the upper surfaces of the third main bodies 40, so that a spacer layer is formed at the top of the third main body 40 in subsequent steps. In one of embodiments, after S720, a step of removing the sacrificial layer 60 is further included.

In one of embodiments, at step S80, forming the third flank wall 250 on each of opposite sidewalls between two adjacent third bodies 40 includes the following steps.

At step S810, a fourth sidewall spacer layer 251 is formed on each of opposite sidewalls between the two corresponding adjacent third main bodies 40.

At step S820, a fifth sidewall spacer layer 252 is formed on a sidewall of the fourth sidewall spacer layer 251.

At step S830, a sixth sidewall spacer layer 253 is formed on a sidewall of the fifth sidewall spacer layer 252.

The fourth sidewall spacer layer 251, the fifth sidewall spacer layer 252 and the sixth sidewall spacer layers 253 together constitute the third flank wall 250.

Figure 19:
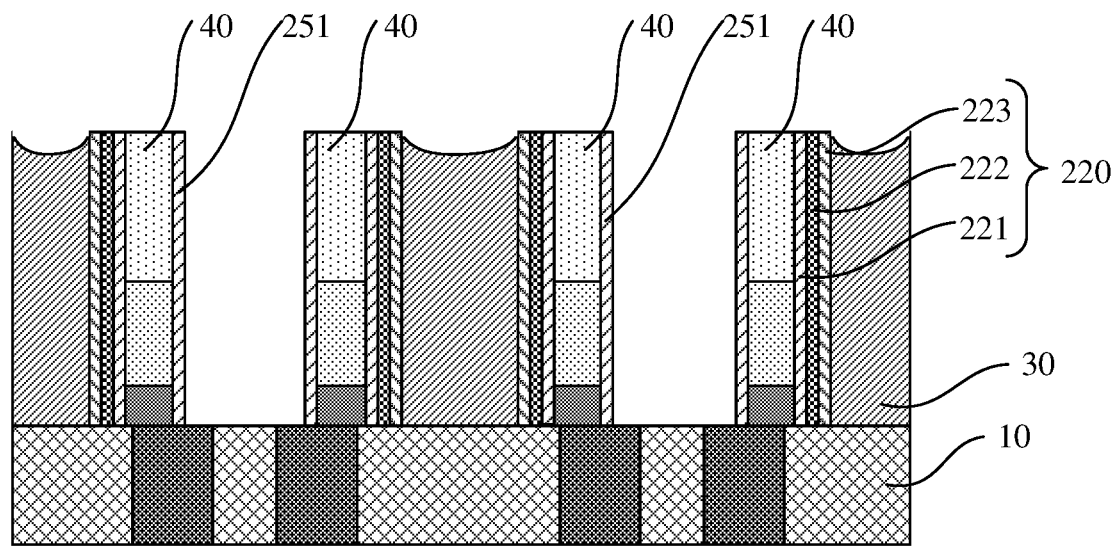
FIG. 19 is a schematic structural diagram of a cross section of a structure obtained after a first sidewall spacer layer is formed on each of exposed sidewalls of two adjacent third main bodies, in a manufacturing method of a semiconductor structure provided in an embodiment.

Please refer to FIG. 19, in one of embodiments, at step S810, a fourth sidewall spacer material layer may be formed by using, but not limited to, a deposition process. In the embodiment, an ALD process may be adopted to form the fourth sidewall spacer material layer on the opposite sidewalls between two corresponding adjacent third main bodies 40, on the surface of the filling layer 30, and on the surface of the substrate 10. Then, the fourth sidewall spacer material layer may be etched by using, but not limited to, a dry etching process to remove fourth sidewall spacer material on the surface of the filling layer 30 and on the surface of the substrate 10 to form the fourth sidewall spacer layer 251. $SF_6$, $CF_4$, $O_2$, Ar or a mixed gas of the above gases can be adopted in the dry etching process, and specific gas selection can be set according to actual needs. In addition, the material and thickness of the fourth sidewall spacer layer 251 can be set according to actual needs. In the embodiment, the fourth sidewall spacer layer 251 may include, but is not limited to, a silicon nitride layer.

Figure 20:
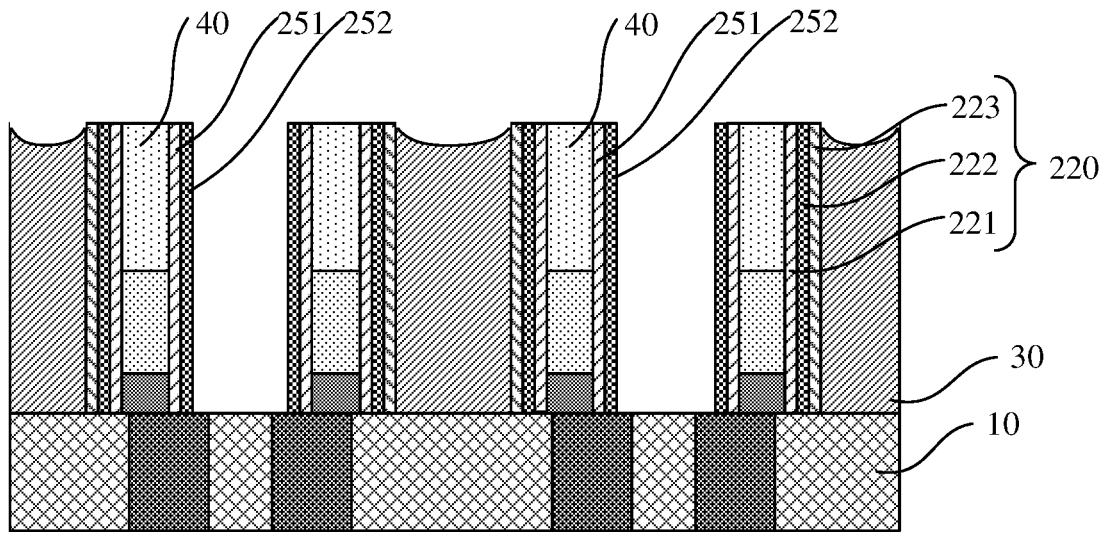
FIG. 20 is a schematic structural diagram of a cross section of a structure after a second sidewall spacer layer is formed on a surface of the first sidewall spacer layer, in a manufacturing method of a semiconductor structure provided in an embodiment.

Please refer to FIG. 20, in one of embodiments, at step S820, a fifth sidewall spacer material layer may be formed by using, but not limited to, a deposition process. In the embodiment, a single ALD process may be adopted to form the fifth sidewall spacer material layer on the sidewall of the fourth sidewall spacer layer 251, on the surface of the filling layer 30 and on the surface of the substrate 10. Then, the fifth sidewall spacer material layer may be etched by using, but not limited to, a dry etching process to remove the fifth sidewall spacer material layer on the surface of the filling layer 30 and on the surface of the substrate 10, to form the fifth sidewall spacer layer 252. $SF_6$, $CF_4$, $O_2$, Ar or a mixed gas of the above gases can be adopted in the dry etching process, and specific gas selection can be set according to actual needs. In addition, the material and thickness of the fifth sidewall spacer layer 252 can be set according to actual needs. In the embodiment, the fifth sidewall spacer layer 252 may include, but is not limited to, a silicon nitride layer.

Figure 21:
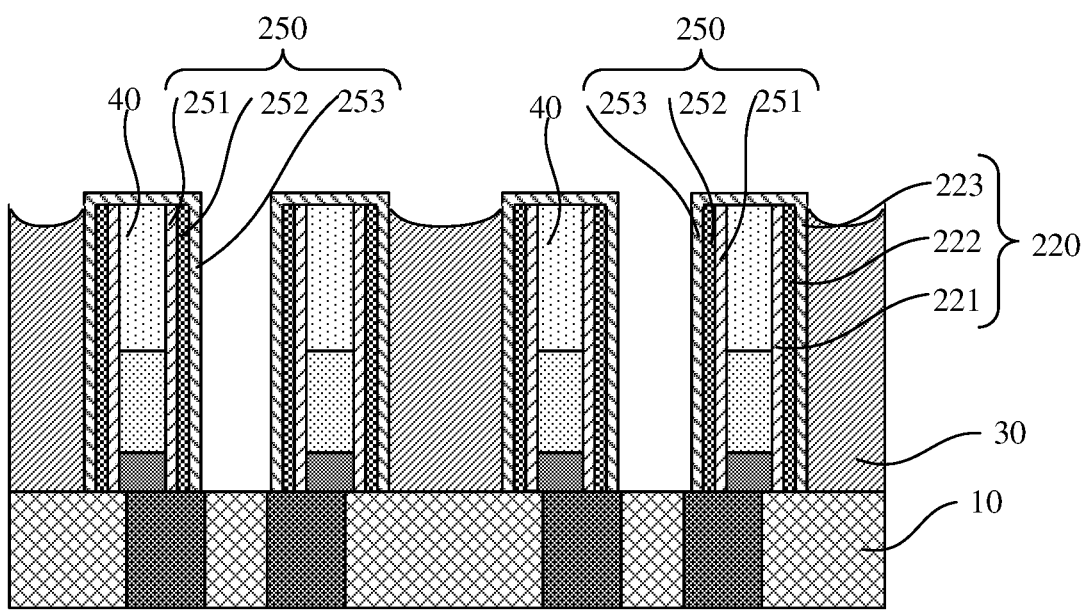
FIG. 21 is a schematic structural diagram of a cross section of a structure obtained after a third sidewall spacer layer is formed on upper surface of the first flank wall, the upper surface of the third main body and the surface of the second sidewall spacer layer, in a manufacturing method of a semiconductor structure provided in an embodiment.

Please refer to FIG. 21, in one of embodiments, at step S830, a sixth sidewall spacer material layer may be formed by using, but not limited to, a deposition process. In the embodiment, a single ALD process may be adopted to form the sixth sidewall spacer material layer on a surface of the fifth sidewall spacer layer 252, on the upper surface of the third main body 40, on the surface of the filling layer 30 and on the surface of the substrate 10. Then, the sixth sidewall spacer material layer may be etched by using, but not limited to, a dry etching process to remove the sixth sidewall spacer material layer on the surface of the filling layer 30 and on the surface of the substrate 10, to form the sixth sidewall spacer layer 253. $SF_6$, $CF_4$, $O_2$, Ar or a mixed gas of the above gases can be adopted in the dry etching process, and specific gas selection can be set according to actual needs. In addition, the material and thickness of the sixth sidewall spacer layer 253 can be set according to actual needs. In the embodiment, the sixth sidewall spacer layer 253 may include, but is not limited to, a silicon nitride layer.

Figure 22:
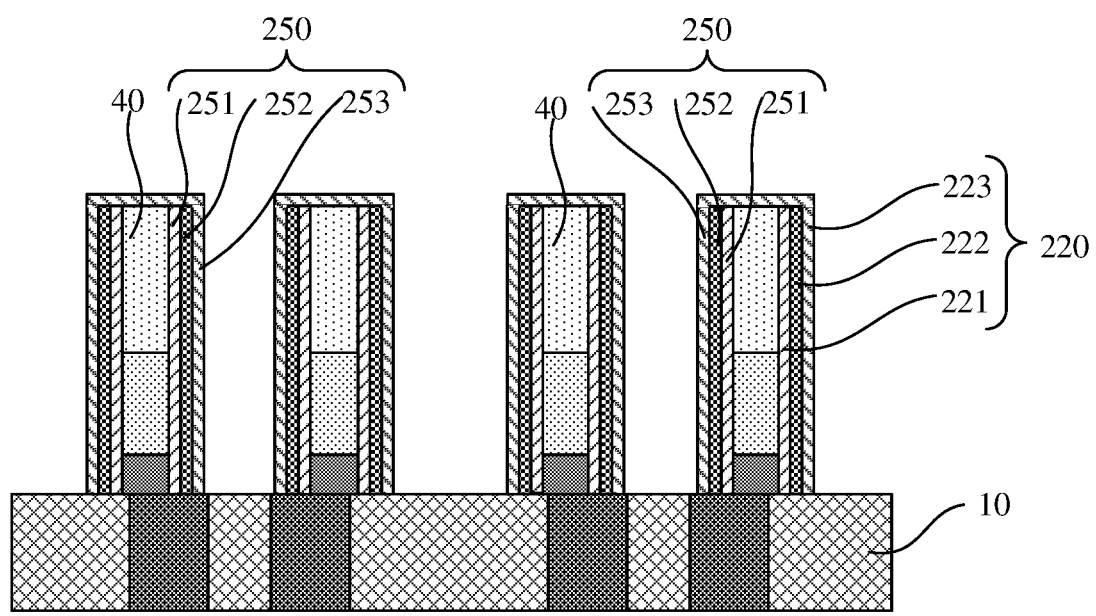
FIG. 22 is a schematic structural diagram of a cross section of a structure obtained after the filling layer is removed to expose the first flank wall, in a manufacturing method of a semiconductor structure provided in an embodiment.

Please refer to FIG. 22, in one of embodiments, at step S90, the filling layer 30 can be removed by using, but not limited to, an etching process to expose the first flank wall 220, thereby completing manufacturing of the third main body 40.

Based on a same inventive concept, the present disclosure further provides a semiconductor structure manufactured by adopting the manufacturing method of the semiconductor structure according to any one of the above embodiments, which is not described in detail herein.

Various technical features in the foregoing embodiments may be randomly combined. For ease of simple description, not all possible combinations of various technical features in the foregoing embodiments are described. However, as long as the combinations of these technical features do not contradict, they should be regarded as falling within the scope of the present specification.

The foregoing embodiments represent only a few implementations of the present disclosure, and are described in more specific and detailed manner, but shall not be construed as limiting the scope of the present disclosure. It is to be noted that those of ordinary skill in the art may further make variations and improvements without departing from the conception of the present disclosure, and these all fall within the protection scope of the present disclosure. Therefore, the protection scope of the present disclosure should be determined based on the appended claims.

The invention claimed is:

1. A manufacturing method of a semiconductor structure, comprising:
    providing a substrate;
    forming, on an upper surface of the substrate, first patterns each comprising a first main body and a first flank wall covering a sidewall of the first main body;
    forming a filling layer which covers the first flank walls and fills a gap between adjacent first patterns; and
    etching a top of each of the first patterns to obtain second main bodies, second flank walls and protrusions located on upper surfaces of the second flank walls, the second flank wall covering a sidewall of the second main body, and a top of the protrusion being at least higher than a top of the second main body.

2. The method of claim 1, wherein forming on the upper surface of the substrate first patterns comprises:
    forming a bit line material stack comprising a bit line barrier layer, a bit line conductive layer and a bit line insulating layer on the upper surface of the substrate;
    etching the bit line material stack to obtain a plurality of first main bodies, wherein there is a gap between adjacent first main bodies to expose the substrate; and
    forming the first flank wall on a sidewall of the first main body.

3. The method of claim 2, wherein forming the first flank wall on the sidewall of the first main body comprises:
    forming a first sidewall spacer layer on a sidewall of the first main body;
    forming a second sidewall spacer layer on a sidewall of the first sidewall spacer layer; and
    forming a third sidewall spacer layer on a sidewall of the second sidewall spacer layer,
    wherein the first sidewall spacer layer, the second sidewall spacer layer and the third sidewall spacer layer together constitute the first flank wall.

4. The method of claim 3, wherein etching the top of each of the first patterns comprises:
    etching the first sidewall spacer layer, the third sidewall spacer layer and the first main body to expose a part of the second sidewall spacer layer to serve as the protrusion.

5. The method of claim 1, wherein forming the filling layer comprises:
    forming a filling material layer on surfaces of the first patterns and in the gap between the adjacent first patterns; and
    etching the filling material layer to expose the top of each of the first patterns.

6. The method of claim 2, after etching the top of each of the first patterns, further comprising:
    forming a bit line mask layer on a side surface of the protrusion;
    by taking the bit line mask layer and the protrusion as a mask, etching each second main body to obtain two corresponding adjacent third main bodies, and to simultaneously obtain a gap between the two corresponding adjacent third main bodies, so as to expose a part of the substrate;
    removing the bit line mask layer and the protrusion to expose upper surfaces of the third main bodies;
    forming a third flank wall on each of opposite sidewalls between the two corresponding adjacent third main bodies; and
    removing the filling layer to expose the second flank wall.

7. The method of claim 6, wherein forming the bit line mask layer on the side surface of the protrusion comprises:

forming a bit line mask material layer on an upper surface of the filling layer, on an surface of the protrusion and on an upper surface of the second main body by adopting an atomic layer deposition process; and etching the bit line mask material layer, to only reserve a part of the bit line mask material layer located on the side surface of the protrusion to serve as the bit line mask layer.

8. The method of claim 6, wherein removing the bit line mask layer and the protrusion to expose the upper surfaces of the third main bodies comprises:

forming a sacrificial layer in the gap between the two corresponding adjacent third main bodies, a height of the sacrificial layer being not larger than a height of the third main body and not lower than a height of the bit line conductive layer in the third main body; and etching the bit line mask layer and the protrusion to expose the upper surfaces of the third main bodies.

9. The method of claim 6, wherein forming the third flank wall on each of opposite sidewalls between the two adjacent third main bodies comprises:

forming a fourth sidewall spacer layer on each of opposite sidewalls between the two corresponding adjacent third main bodies;

forming a fifth sidewall spacer layer on a sidewall of the fourth sidewall spacer layer; and forming a sixth sidewall spacer layer on a sidewall of the fifth sidewall spacer layer, wherein the fourth sidewall spacer layer, the fifth sidewall spacer layer and the sixth sidewall spacer layer together constitute the third flank wall.

10. The method of claim 1, wherein a top of the filling layer is lower than the top of the first pattern.

11. The method of claim 10, wherein a height of the filling layer is greater than or equal to two thirds of a height of the first pattern.

12. A semiconductor structure manufactured by following operations:

providing a substrate;

forming, on an upper surface of the substrate, first patterns each comprising a first main body and a first flank wall covering a sidewall of the first main body;

forming a filling layer which covers the first flank walls and fills a gap between adjacent first patterns; and etching a top of each of the first patterns to obtain second main bodies, second flank walls and protrusions located on upper surfaces of the second flank walls, the second flank wall covering a sidewall of the second main body, and a top of the protrusion being at least higher than a top of the second main body.

13. The semiconductor structure of claim 12, wherein forming on the upper surface of the substrate first patterns comprises:

forming a bit line material stack comprising a bit line barrier layer, a bit line conductive layer and a bit line insulating layer on the upper surface of the substrate;

etching the bit line material stack to obtain a plurality of first main bodies, wherein there is a gap between adjacent first main bodies to expose the substrate; and forming the first flank wall on a sidewall of the first main body.

14. The semiconductor structure of claim 13, wherein forming the first flank wall on the sidewall of the first main body comprises:

forming a first sidewall spacer layer on a sidewall of the first main body;

forming a second sidewall spacer layer on a sidewall of the first sidewall spacer layer; and forming a third sidewall spacer layer on a sidewall of the second sidewall spacer layer, wherein the first sidewall spacer layer, the second sidewall spacer layer and the third sidewall spacer layer together constitute the first flank wall.

15. The semiconductor structure of claim 14, wherein etching the top of each of the first patterns comprises:

etching the first sidewall spacer layer, the third sidewall spacer layer and the first main body to expose a part of the second sidewall spacer layer to serve as the protrusion.

16. The semiconductor structure of claim 12, wherein forming the filling layer comprises:

forming a filling material layer on surfaces of the first patterns and in the gap between the adjacent first patterns; and etching the filling material layer to expose the top of each of the first patterns.

17. The semiconductor structure of claim 13, after etching the top of each of the first patterns, the following operations are further comprised:

forming a bit line mask layer on a side surface of the protrusion;

by taking the bit line mask layer and the protrusion as a mask, etching each second main body to obtain two corresponding adjacent third main bodies, and to simultaneously obtain a gap between the two corresponding adjacent third main bodies, so as to expose a part of the substrate;

removing the bit line mask layer and the protrusion to expose upper surfaces of the third main bodies;

forming a third flank wall on each of opposite sidewalls between the two corresponding adjacent third main bodies; and removing the filling layer to expose the second flank wall.

18. The semiconductor structure of claim 17, wherein forming the bit line mask layer on the side surface of the protrusion comprises:

forming a bit line mask material layer on an upper surface of the filling layer, on an surface of the protrusion and on an upper surface of the second main body by adopting an atomic layer deposition process; and etching the bit line mask material layer, to only reserve a part of the bit line mask material layer located on the side surface of the protrusion to serve as the bit line mask layer.

19. The semiconductor structure of claim 17, wherein removing the bit line mask layer and the protrusion to expose the upper surfaces of the third main bodies comprises:

forming a sacrificial layer in the gap between the two corresponding adjacent third main bodies, a height of the sacrificial layer being not larger than a height of the third main body and not lower than a height of the bit line conductive layer in the third main body; and etching the bit line mask layer and the protrusion to expose the upper surfaces of the third main bodies.

20. The semiconductor structure of claim 17, wherein forming the third flank wall on each of opposite sidewalls between the two adjacent third main bodies comprises:

forming a fourth sidewall spacer layer on each of opposite sidewalls between the two corresponding adjacent third main bodies;

forming a fifth sidewall spacer layer on a sidewall of the fourth sidewall spacer layer; and forming a sixth sidewall spacer layer on a sidewall of the fifth sidewall spacer layer,
wherein the fourth sidewall spacer layer, the fifth sidewall spacer layer and the sixth sidewall spacer layer together constitute the third flank wall.

* * * * *